July 28, 1959 R. J. ZELINKA 2,897,295

CASCADED TETRODE TRANSISTOR AMPLIFIER

Filed June 28, 1956

INVENTOR.
RICHARD J. ZELINKA

BY Frederick E. Lange

ATTORNEY

United States Patent Office 2,897,295
Patented July 28, 1959

2,897,295

CASCADED TETRODE TRANSISTOR AMPLIFIER

Richard J. Zelinka, Lino Lakes, Minn., assignor to Minneapolis-Honeywell Regulator Company, Minneapolis, Minn., a corporation of Delaware Application June 28, 1956, Serial No. 594,618

13 Claims. (Cl. 179—171)

Figure 1:
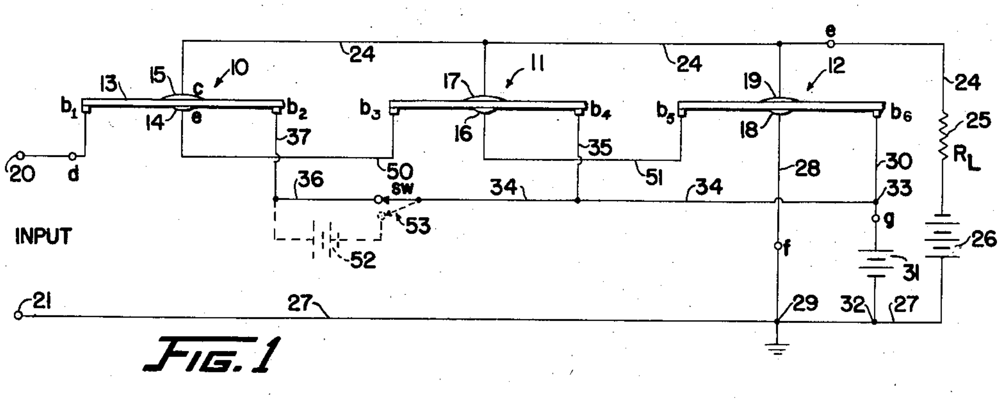

This application relates to tetrode transistor circuits and more specifically to a compound or composite tetrode junction transistor circuit.

In the past considerable work has been done in the field of composite triode transistors, as has been disclosed by the work of Pearlman in an article entitled "Some Properties and Circuit Applications of Super-Alpha Composite Transistors," published in the January 1955 issue of "IRE Transactions on Electron Devices," and also disclosed by the Darlington Patent 2,663,806. These references show that an amplifying device having the characteristics of a super-alpha transistor can be constructed by making suitable interconnections between ordinary triode transistors. For example, two junction triode transistors may have their collector electrodes interconnected forming one external terminal, the emitter electrode of one unit being directly connected to the base of the second, and the remaining base electrode and emitter electrode form the second and third terminals respectively of the device, to form a three terminal amplifying device having improved characteristics.

A limitation of this type composite device is that it is extremely temperature sensitive, due to the fact that the collector junction leakage currents of the individual transistors vary greatly with temperature resulting in variations of output current, with change in operating temperature, which current changes are not controllable by the input stage. In the triode composite unit the collector junction leakage currents cannot be held to the fundamental leakage component but include the fundamental leakage times the current gain of the transistor. In addition the leakage of one unit of the composite is amplified by the succeeding transistor of the composite which aggravates the situation. In many instances, such as military applications, where the equipment must operate over temperature extremes from —60° F. to +180° F. or higher, the basic triode composite circuits cannot be used, because a relatively small temperature increase can increase the output current of the final transistor to saturation due entirely to leakage current. My invention is an improvement in the art over the type of composite units hereabove discussed and provides a composite tetrode transistor apparatus which is relatively stable over wide variations in ambient temperature, which has transconductance characteristics which are very linear, and in which the total leakage current of the composite tetrode is the arithmetic sum of the individual fundamental leakage currents $Ic_0$ and in which the leakage of one unit is not amplified by the succeeding unit as in the prior art.

It is an object of this invention, therefore, to provide a composite type tetrode transistor amplifying apparatus comprising a plurality of tetrode transistors suitably interconnected and utilizing a minimum of other electronic components.

It is a further object of this invention to provide a composite type tetrode transistor amplifying apparatus which is extremely stable in operation over wide extremes of temperature variation and in which the collector junction leakage of one unit of the composite is not amplified by succeeding units of the composite.

Figure 4:
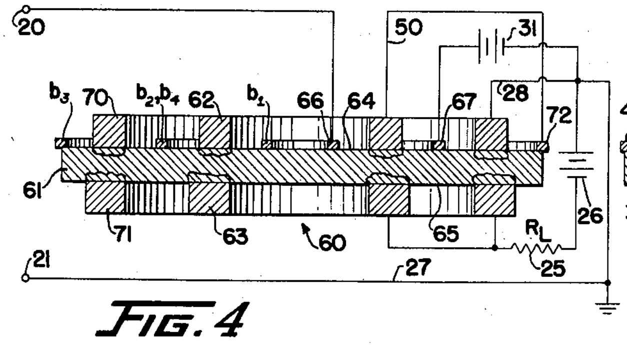
Figure 2:
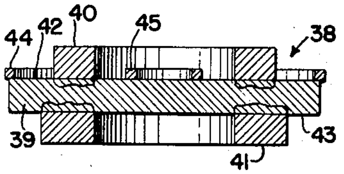
Figure 5:
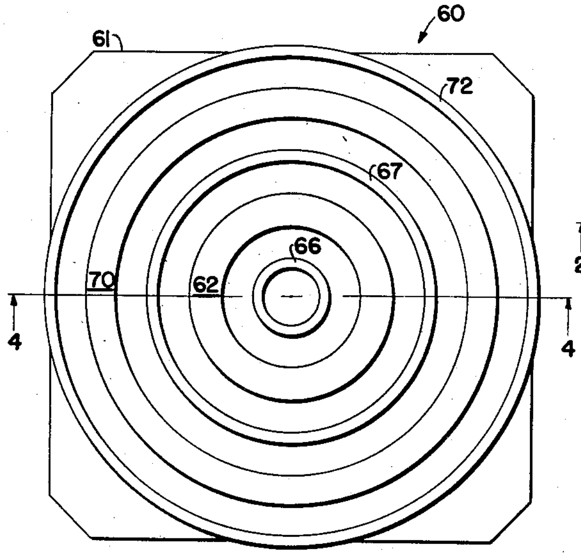
Figure 3:
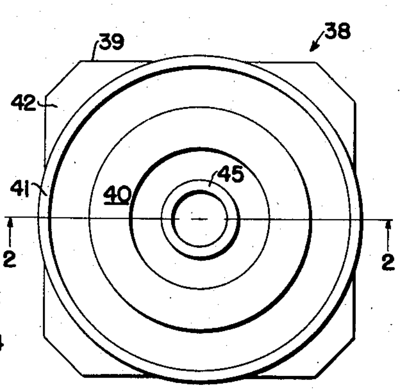

These and other objects of my invention will become apparent upon consideration of the accompanying claims, specification and drawings of which:

Figure 1 is a schematic diagram of an embodiment of my invention;

Figures 2 and 3 are diagrammatic representations of the construction of a tetrode transistor well adapted for use in this invention, Figure 3 being a top plan view of the device, and Figure 2 being a cross sectional view taken along lines 2—2 of Figure 3; and Figures 4 and 5 are diagrammatic representations of a double tetrode transistor constructed on a single wafer of germanium and which is well adapted for use in this invention.

Referring now to Figure 1, there is disclosed a composite type tetrode transistor apparatus comprising tetrode transistors 10, 11 and 12 respectively. Transistor 10 is a diffused junction type tetrode and may be of the type disclosed in the copending application entitled "Semiconductor Devices," Serial No. 556,210, filed December 29, 1955, and assigned to the same assignee as the present invention. Figures 2 and 3 disclose an embodiment of the transistor device of the copending application. As can be seen by reference to these figures, the collector and emitter electrodes 41 and 40 are annular in form, and the base connections *b*1 and *b*2, 44 and 45 respectively, are likewise annular, *b*1 being located around the emitter annulus and base connection *b*2 being located within the emitter ring. It is to be understood, however, that any other suitable type tetrode transistor may be used. The transistor 10 includes a wafer 13 of semiconductive material such as germanium, which has two low resistance base electrode connections *b*1 and *b*2 attached thereto. The transistor also has an emitter electrode 14 and a collector electrode 15 making rectifying junction connection with said wafer. It will be noted that the base connections *b*1 and *b*2 are so positioned on the base 11 that the emitter and collector junctions are positioned between them. A resistive current path exists between the two base connections with the majority of the base resistance in the bridge area between the collector and emitter junctions.

The transistors 11 and 12 may be similar to transistor 10 if desired, however, because of the varied current requirements of the different stages of amplification, it may be advantageous to construct them of different physical sizes to make most efficient use of the transistors, and to operate each in its most efficient current amplifying range. Transistor 11 likewise includes a wafer of semiconductive material, which has two low resistance base electrode connections *b*3 and *b*4 attached thereto. The transistor also has an emitter junction electrode 16 and a collector junction electrode 17. Transistor 12 similar to the other transistors, has two base electrode connections *b*5 and *b*6, an emitter junction electrode 18 and a collector junction electrode 19.

Referring again to Figure 1, there is disclosed a three-stage transistor amplifier in which the electrodes of the tetrode transistors are interconnected to form a resultant four-terminal amplifying device identifiable at points *d*, *e*, *f* and *g*, point *d* being connected to base *b*1, point *e* being connected to the collector electrodes 15, 17 and 19, point *f* being connected to the emitter 18, and point *g* being connected to the base electrodes *b*6, *b*4 and *b*2. The three stages are shown for the purpose of illustration, and more or less stages of amplification utilizing this invention may be used as required.

The base electrode *b*1 of transistor 10 is directly connected by a conductor to an input terminal 20 which is one of a pair of input terminals 20 and 21. The input terminals may be connected to any suitable source of input signal, not shown. The collector junction electrodes 15, 17 and 19 of transistors 10, 11 and 12 respectively are directly interconnected by a conductor 24. An extension of the conductor 24 is connected to a suitable load impedance 25, here shown as a resistive load. The other tereminal of load 25 is connected to a source of electrical potential 26, here shown as a battery. The opposite terminal of battery 26 is connected to a ground conductor 27, which conductor 27 is also connected to the input terminal 21. A conductor 28 connects the emitter electrode 18 of transistor 12 to a junction 29 on ground conductor 27. The base connection *b6* on transistor 12 is connected through a conductor 30 and a source of bias potential 31 to a junction 32 on conductor 27. The bias potential source 31 is also connected to base connection *b4* on transistor 11 by conductor 30, a junction 33 on conductor 30, and conductors 34 and 35, and to base connection *b2* on transistor 10 by the conductor 30, junction 33 and conductors 34, 36 and 37.

The emitter junction electrode 14 of transistor 10 is directly connected by a conductor 50 to the base connection *b3* of transistor 11. Likewise the emitter electrode 16 of transistor 11 is directly connected to the base connection *b5* of transistor 12 by a conductor 51. Under certain conditions of operation it may be desirable to change the bias potential applied to base connection *b2* to a potential other than that supplied by the bias source 31 and therefore the battery 52 and switch 53 are provided in the base electrode *b2* circuit for this eventuality.

Attention is now directed to Figures 2 and 3 wherein there is shown one device which is particularly applicable to the features of the present invention. There is shown a tetrode transistor generally designated 38 which includes a semiconductive body 39 having a pair of junction electrodes 40 and 41 situated in oppositely disposed relationship on a pair of parallelly disposed surfaces 42 and 43 respectively. The emitter electrode 40 is situated between the pair of low resistance base electrode connections 44 and 45 and is preferably somewhat smaller in width dimension than is the corresponding collector electrode 41. Details of this device are more clearly set forth in the copending application entitled "Semiconductor Devices" previously referred to. It has been found that good amplification, gain, and control characteristics are obtained when a device such as is shown in Figures 2 and 3 is utilized. It will be appreciated that the transistors 10, 11 and 12 of Figure 1 may very well represent a partial view i.e., the right or left of transistor 38.

In the case where two tetrode transistors are interconnected according to this invention to form a composite transistor unit, a preferred tetrode transistor type is shown in Figures 4 and 5. Directing attention to Figures 4 and 5, there is shown a semiconductor device which is particularly adaptable to the features of the present invention. Thus there is shown a transistor 60 which includes a semiconductor body 61 having two tetrode transistors on one body comprising first annular shaped emitter and collector junction electrodes 62 and 63, respectively, situated in oppositely disposed relationship on a pair of parallelly disposed major surfaces 64 and 65 of body 61. The emitter junction electrode 62 is situated between a pair of low resistance base electrode connections 66 and 67, and is preferably somewhat smaller in width dimension than is the corresponding collector junction electrode 63. The transistor 60 also includes second emitter and collector electrodes 70 and 71 respectively, which are also annular and which are situated around the first mentioned emitter and collector and situated in oppositely disposed relationship on the parallelly disposed surfaces 64 and 65. The emitter electrode 70 is situated outside the base connection 67 and within the base connection 72. In this device the base connections 66 and 72 may be represented in Figure 1 by base connections *b1* and *b3* respectively. The base 67 is common to both transistor stages of composite transistor 60, and may represent in Figure 1 both the base connections *b2* and *b4*. Details of this device are more clearly set forth in my copending application entitled "Semiconductor Device," Serial No. 594,427, filed of even date herewith and assigned to the same assignee as the present invention. Circuit connections have been shown in Figure 4 to make it more clearly apparent how the preferred embodiment of the transistor shown in Figures 4 and 5 is used in this invention.

*Operation*

The circuit of Figure 1 has for its purpose the providing of a very high gain composite tetrode transistor amplifying device which is temperature stable over a wide variation of operating temperature, and in which no feedback is needed to provide stability, whereby the amplifier circuitry is greatly simplified. As can be seen from Figure 1 the three tetrode transistors 10, 11 and 12 are so interconnected by direct coupling as to form a resultant composite four terminal transistor having very desirable characteristics. Three transistors so intereconnected have been shown for the purpose of illustration, and the invention is equally applicable to two transistors so interconnected or more than three. As can be seen from the figure, all of the collector electrodes are directly interconnected by a conductor, and terminal *e* on the conductor represents the collector electrode terminal of the composite unit. The base connection *b1* of the transistor 10 is directly connected to the input terminal 20 by a conductor and the terminal *d* on that conductor represents the first base connection of the composite unit. The base connections *b2*, *b4* and *b6* are directly interconnected by conductors or resistive or potential means and the terminal *g* represents the second base terminal of the composite transistor. The fourth terminal and emitter electrode of the composite tetrode is the emitter electrode of transistor 12.

The collector electrode terminal *e* of the composite unit is connected through the load device 25 to the negative terminal of the source of energizing potential 26, the other terminal of the source being grounded. The load device 25 may be any suitable load such as, for example, a motor winding, a relay winding, the input to a further amplifying stage, or a loudspeaker voice coil. It will be noted that the collector output currents from all of the individual transistors making up the composite unit flows through the load device 25. By referring to the drawing it can be seen that the composite emitter terminal *f* is connected to ground, and that this terminal is common to the input and output circuits, so that a common emitter configuration is disclosed. The emitter 14 of transistor 10 is directly connected to the control base *b3* of transistor 11 so that the emitter current of transistor 10 is the control current of transistor 11. Likewise the emitter 16 of transistor 11 is directly connected to the control base *b5* of transistor 12.

The bias battery 31 which is a constant voltage source is connected between the base connections *b2*, *b4* and *b6* and the composite transistor emitter terminal *e*. This constant bias voltage provides a unique arrangement between the bias base electrode and the emitter. The polarity of this bias source is in a direction to back bias the emitter junctions of the transistors, and the magnitude of the bias source is relatively large, for example 5 volts, with respect to the input signal potential required to drive the transistor to maximum output current.

In the field of transistors it is conventional to place a relatively small bias potential in the forward direction, that is in the direction of easy current flow, across the emitter to base junction, and to place a relatively large potential in the back direction or reverse direction across the collector to base junction. In this manner the proper polarities of potential are applied to the transistor to cause it to conduct. Minority carriers are injected from the emitter into the base region by the forward bias, and these minority carriers are collected by the collector electrode to initiate the collector current flow. In considering the circuit of Figure 1 it will be seen that the bias potential source 31 is directly connected between the base electrode *b6* and the emitter 18 of transistor 12, thereby applying essentially the entire 5 volts across the emitter junction in the reverse direction. It has been discovered that by impressing a hard back bias between the emitter electrode and one base electrode of the tetrode, that the transistor transconductance can be made linear and also that the ratio of input current to output current can be made linear. This effect is more completely discussed in the copending application Serial No. 572,983 in the name of Marshall et al., entitled "Transistor Circuit" filed March 21, 1956, and assigned to the same assignee as the present invention.

In all semiconductor diodes the diode junctions are subject to a minute reverse current known commonly as leakage current, when a reverse potential is applied across the junction, and junction transistors are no exception, the basic collector junction leakage current being designated $Ic_0$. The magnitude of this leakage current is proportional to temperature. Similarly the emitter junction of a transistor has a leakage current when a reverse potential is applied across the junction. In Figure 1, therefore, a current path may be traced from the positive terminal of bias source 31 through conductor 30, to base connection *b6*, through the semiconductor wafer body to the emitter and collector junctions where the current path divides, one part, the emitter leakage current, continuing through the emitter junction and conductors 28 and 27 to the negative terminal of source 31, and the other current, $Ic_0$, the collector leakage current flowing through the collector junction, conductor 24, load 25, battery 26, which is polarized in an aiding direction and conductor 27 to the negative terminal of bias source 31. As has been previously stated a resistive path exists between the base electrodes *b5* and *b6* through the semiconductor body, with the majority of the resistance being located in the bridge area between the collector and emitter electrodes. The current described flowing through the resistive body result in a potential drop or gradient across the semiconductor body so that the entire bias potential of 5 volts cannot be applied directly across the emitter junction. In the transistor 12, for example, the potential across the emitter junction in the area adjacent to base *b6* may approach closely 5 volts, while the area of the emitter junction remote from base electrode *b6* will be somewhat less. A current path can be further traced from that point to base electrode *b5* and through conductor 51 to the emitter 16 of transistor 11. The bias source 31 is directly connected to the base *b4* by conductors 30, 34 and 35 so that a reverse potential of lesser magnitude is also applied across the emitter-base junction of transistor 11. This transistor also has a collector leakage current $Ic_0$ and a current path may be traced from bias source 31 through the conductors 30, 34 and 35 to base electrode *b4*, and through the semi conductive body of transistor 11, leaking through the collector junction, through conductor 24, load 25, source 26 and conductor 27 to the negative terminal of the bias source. It will be appreciated that in each of these transistors the fundamental leakage current $Ic_0$ of each unit is supplied from its respective base bias connection. In this case since the emitter junctions are cut off by the back bias, relatively few minority carriers are flowing into the transistor, the current in the base electrode path being an electron flow, and therefore the only current flowing in the collector circuits is the basic $Ic_0$. If the collector leakage current is not supplied from the base electrodes, as heretofore described, this collector leakage current would have to be supplied from the emitter. In this case the collector leakage current can no longer be limited to $Ic_0$ but increases to $$\frac{Ic_0}{1-\alpha}$$

which term includes the amplification of the transistor, where $\alpha$ is defined as the ratio of the change in collector current to the change in emitter current at a constant collector potential. This factor is explained in detail in the text "Principles of Transistor Circuits," by Shea, copyright 1953 by John Wiley and Sons.

In certain cases of operation of the present invention it may be desirable to connect the bias base electrodes *b2*, *b4* and *b6* through an impedance to ground instead of through the source 31, or in some cases it may be desirable to directly connect these base electrodes to ground eliminating the source 31. In addition any combination of bias and impedance may be used. In these instances the collector leakage current is still supplied to a substantial degree by means of the base electrodes *b2*, *b4* and *b6* rather than from the respective emitter circuits. That this is so can be appreciated from tests run on the composite circuit of Figure 1 in which Minneapolis-Honeywell experimental tetrode transistors were used, and in which the composite unit was made up of two transistors. In the test the source of potential 26 was equal to 30 volts D.C. and a back bias potential of 6 volts was used. The input terminal 20 was left open and with the two transistors composite transistors with the back bias supplied to the base the leakage current was 1.7 milliamp.; with the bias base directly grounded the composite unit leakage was 17.5 milliamp. and the same two units connected as triodes instead of tetrodes, i.e., the bias bases left open, the leakage current was 7.5 amperes, this being so high as to make the circuit impractical.

In the prior art, previously mentioned, it has been proposed to combine several triode transistors into one unit to form a composite transistor, and in applying the principles above described to the conventional composite triode transistor, above referenced, it is possible to reduce the collector leakage current to the fundamental leakage $Ic_0$ on only the first of the transistors making up the composite unit by proper bias to the input electrode, the second transistor of the triode composite unit then having no base current flowing therein, and thereby the second stage acting essentially as an open base transistor in which its collector leakage current must come from the emitter circuit and has a magnitude of $$\frac{Ic_0}{1-\alpha}$$

When the leakage current includes the factor of amplification of the transistor, the temperature instability of the composite unit renders the utility limited to conditions where the operating temperature can be maintained reasonably stable.

In the instant invention, however, as shown in Figure 1, the bias potential applied to the base connections *b2*, *b4* and *b6*, respectively, from source 31 provides the collector leakage current of each transistor and also provides a back bias on each emitter junction to assure that the collector leakage is supplied through the base circuit and not from the respective emitter. The resultant composite transistor leakage current of my invention therefore, is merely the arithmetic sum of the individual $Ic_0$ of each transistor comprising the composite unit.

In the composite unit the input bias condition for all of the individual units comprising the composite transistor is controlled by the signal input to the first stage and by the common termination of the bias base electrodes. In the circuit of Figure 1, under no-signal conditions, the back bias applied to the transistors by the bias source 31 maintains the transistors cutoff so that no emitter current or output current other than leakage current flows. If desired a controllable D.C. potential may be applied to the input connections to bias the composite at or near the threshold of conduction, or to bias the unit class A.

Let us assume that a sufficient signal potential is applied to the input terminals 20 and 21 to overcome the threshold and cause the composite transistor to commence conducting. The complete current path for this input current can be traced from input terminal 20, to base electrode *b*1 to the emitter junction electrode 14, through conductor 50 to the base electrode *b*3 of transistor 11, through the transistor to the emitter electrode 16, through conductor 51 to the base electrode *b*5 of transistor 12, through the transistor to the emitter electrode 18, and through conductors 28 and 27 to the other input terminal 21. This current path may be established in the following manner. Assuming that in the no-signal condition the units are cut off, then as a signal is applied to the input terminal 20 a transverse base current begins to flow from the base electrode *b*2 transversely through the semiconductive body 13 to the base electrode *b*1. Due to the resistive nature of the semiconductor body a potential gradient is created between the base electrodes due to the transverse current, and the voltage gradient is such that for some value of transverse current the potential across the emitter junction at the edge adjacent base electrode *b*1 causes emitter current to flow across the emitter junction in this area and out electrode *b*1 to the input. The emitter current, of course, injects minority carriers into the base region which are collected by the collector 15 causing collector current to flow. The emitter current flowing in transistor 10 comes from the control base electrode *b*3 of transistor 11 through the conductor 50. Likewise the emitter current of transistor 11 comes from the control base electrode *b*5 of transistor 12 through conductor 51. The operation of the transistors 11 and 12 is similar to that explained for transistor 10 except that the magnitudes of current involved are greater with each subsequent stage.

For a composite transistor circuit comprising two individual tetrode transistors interconnected to form a composite unit, the transistor configuration disclosed in Figures 4 and 5, which incorporates two tetrode transistors on a single semiconductive crystal body, is an embodiment well adapted for use in this invention. In Figure 4 electrical circuit connections have been disclosed connected to the sectional view of the transistor to illustrate the basic connection for use as an amplifier. The first stage of the composite unit comprises emitter 62, collector 63, and base electrodes 66 and 67. The second stage of the composite unit comprises emitter 70, collector 71 and base electrodes 67 and 72. It will be noted that base electrode 67 is common to both of the individual transistors making up the composite and to this base electrode is applied the hard back bias potential 31. The circuit attached to this transistor is the same as shown in Figure 1 except that the composite unit is made up of two individual transistors instead of three.

Many changes and modifications of this invention will undoubtedly occur to those who are skilled in the art and I therefore wish it to be understood that I intend to be limited by the scope of the appended claims and not by the specific embodiment of my invention which is disclosed herein for the purpose of illustration only.

I claim:

1. A signal amplifying device comprising: a plurality of tetrode transistors, each of said transistors including a collector electrode, an emitter electrode, and first and second base electrodes; load means; a source of electrical potential; means directly interconnecting said collector electrodes and further connecting said collectors through said load means and said source of electrical potential to the emitter of the last of said plurality of transistors; a source of bias potential; means connecting said bias potential source intermediate the emitter electrode of the last of said plurality of transistors and said second base electrodes in a polarity direction to tend to provide a reverse bias across the emitter junctions; means connecting the first base electrode of the first of said plurality of transistors to a source of signal; and means directly connecting the emitter electrode of each save the last of said plurality of transistors to the first base of the subsequent of said plurality of transistors.

2. A composite tetrode transistor amplifying apparatus comprising: a plurality of tetrode transistor means, each of said transistor means having a semiconductor body and including a plurality of electrodes comprising an emitter electrode, a collector electrode, and first and second base electrodes, said base electrodes being positioned on opposite sides of said emitter electrode, each of said electrodes being parallelly disposed and having a substantially annular configuration; conductive means directly interconnecting said collector electrodes of said plurality of transistor means; circuit means connecting a source of input signal current intermediate the first base electrode of a first of said plurality of transistor means and the emitter electrode of the last of said plurality of transistor means; means directly connecting the emitter electrode of each of said plurality of transistor means save the last to the first base electrode of the subsequent one of said plurality of transistor means; a source of bias potential; means connecting together said second base electrodes; means connecting said source of bias potential intermediate said emitter electrode of said last transistor means and said second base electrode, said potential being of such a polarity as to provide a reverse bias across the emitter-base junctions of said transistor means; and output means connected intermediate said emitter electrode of said last transistor means and said collector electrodes.

3. A composite tetrode transistor amplifying apparatus comprising: a plurality of junction tetrode transistors, each of said transistors having a semiconductive body and including a plurality of electrodes comprising an emitter electrode, a collector electrode, and first and second base electrodes, said emitter and collector electrodes making rectifying junction contact with said semiconductive body; conductive means directly interconnecting said collector electrodes; a reference potential point; means directly connecting the emitter electrode of the last of said plurality of transistors to said reference potential point; circuit means connecting a source of input signal current intermediate said reference potential point and the first base electrode of a first of said transistors thereby connecting said input signal current source to the composite transistor input terminals; output means; a source of energizing potential; means connecting said output means and said source of energizing potential in series and intermediate said reference potential point and said collector electrodes; means directly connecting the emitter of each save the last of said plurality of transistors to the first base electrode of the succeeding transistor; means directly connecting together the second base electrodes of said plurality of transistors; and a source of bias potential connected intermediate said emitter electrode of said last transistor and said second base electrodes said potential being of a polarity to apply a reverse bias across said emitter-base junctions.

4. Signal translating apparatus comprising: a pair of tetrode semiconductor amplifying means, each of said semiconductor means including an input electrode adapted to be connected to an input circuit, an output electrode adapted to be connected to an output circuit, a further electrode common to said input and output circuits, said output electrode and one other aforesaid electrode making junction contact with the semiconductor body, and a bias electrode; means directly interconnecting said output electrodes of said pair of semiconductor means; means connecting said further electrode of a first of said pair to the input electrode of the second of said pair of semiconductor means; means connecting the input electrode of the first and the common electrode of the other of said semiconductor means to a source of signal potential; a source of bias potential; means connecting said bias potential source intermediate the further electrode of said second and the bias electrodes of said pair of semiconductor means in a polarity direction to tend to apply a reverse bias on the further electrode junctions and thereby minimize the output circuit leakage current; a source of electrical potential; and circuit means including load means and said source of electrical potential connected intermediate said further electrode of said second semiconductor means and said output electrodes for energizing said translating apparatus.

5. Transistor amplifying means comprising: first and second tetrode transistor means, each of said transistor means including a collector electrode, an emitter electrode, and first and second base electrodes; means directly interconnecting said collector electrodes; a source of electrical potential; load means; circuit means including said load means connecting said source of potential intermediate said collector electrodes and the emitter of said second transistor means; a source of bias potential; means directly connecting said bias potential intermediate said second base electrodes and said second transistor emitter electrode in a polarity direction to tend to provide a reverse bias on the emitter junctions; means directly connecting the emitter of said first transistor means to the first base electrode of said second transistor means; and means connecting said first base electrode of said first and the emitter of said second transistor means to a source of signal potential.

6. A signal translating apparatus comprising: first and second tetrode semiconductor amplifying means, each of said semiconductor means including an input electrode, an output electrode making junction contact with the semiconductor body, a further electrode, and a bias electrode, said electrodes each having a substantially annular configuration with the further electrode being positioned between said input electrode and said bias electrode; first connection means directly connecting together said output electrodes of said first and second semiconductor means; second connection means directly connecting the further electrode of said first semiconductor means to the input electrode of said second semiconductor means; circuit means connecting a source of signal potential intermediate the input electrode of said first semiconductor means and the further electrode of said second semiconductor means; a source of bias potential; means connecting said source of bias potential intermediate said second semiconductor means further electrode and said bias electrodes in a polarity direction to tend to provide a reverse bias on the further electrode junctions and thereby minimize the leakage current of said output electrodes; and output means, said output means being connected intermediate said second semiconductor means further electrode and said output electrodes of said first and second semiconductor means.

7. Signal translating apparatus comprising: first and second tetrode junction transistors, each of said transistors having a semiconductive body and including a plurality of electrodes comprising a collector electrode, an emitter electrode and first and second base electrodes, said emitter and base electrodes having a substantially annular configuration with one base electrode being positioned on each side of said emitter electrode, said emitter and collector electrodes making rectifying junction contact with said body and said first and second base electrodes making low resistance contact with said semiconductive body; first connection means directly connecting together said collector electrodes of said first and second transistors; second connection means directly connecting the emitter electrode of said first transistor to the first base electrode of said second transistor; circuit means connecting a source of signal potential intermediate the first base electrode of said first transistor and the emitter electrode of said second transistor; a source of bias potential; means connecting said source of bias potential intermediate said second transistor emitter electrode and and said second base electrodes in a polarity direction to tend to apply a reverse bias on the emitter junctions; and output means, said output means being connected intermediate said second transistor emitter electrode and said collector electrodes.

8. Multistage tetrode transistor apparatus connected as a composite amplifying device comprising: first and second tetrode transistor means, each of said transistor means having a semiconductor body and including a collector electrode, an emitter electrode, and first and second base electrodes, said base electrodes making low resistance contact with said semiconductive body and said emitter and collector electrodes making rectifying junction contact with said body; means directly interconnecting said collector electrodes; a reference potential point; means directly connecting the emitter electrode of said second transistor means to said reference potential point, circuit means connecting a source of input signal current intermediate said reference potential point and the first base electrode of said first transistor means; means directly connecting the emitter of said first transistor means to the first base electrode of said second transistor means; a source of potential; means including load means connecting said source of potential intermediate said reference potential point and said collector electrodes; and circuit means including bias potential means connecting together said second base electrodes and further connecting said electrodes to said reference potential point, said bias potential means being in a polarity direction to provide a reverse bias on said emitter junctions.

9. Composite tetrode semiconductor amplifying apparatus comprising: a wafer of substantially single crystalline semiconductor material of one conductivity type having first and second parallelly disposed major surfaces, said first surface including an ohmic base contact and first and second junction areas of substantially opposite conductivity type than said wafer situated in spaced relationship to said first base contact, third and fourth output junction areas situated on said second major surface in oppositely disposed physical and electrical relationship to said first and second junction areas respectively, and second and third ohmic base contacts making contact with said wafer at points removed from said first and second junction areas; conductive means directly interconnecting said third and fourth junction areas; circuit means connecting a source of input signal current intermediate said first base contact and said second junction area; means directly connecting said first junction area to said third base contact; a source of bias potential; means connecting said source of bias potential intermediate said second junction area and said second base contact, said bias potential being of such a polarity as to provide a reverse bias across said first and second junction areas thereby minimizing the leakage currents of said third and fourth junctions; and output means connected intermediate said second junction area and said third and fourth junction areas.

10. Multistage tetrode transistor apparatus connected as a composite transistor amplifying device comprising; a wafer of substantially single crystalline semiconductor material having first and second parallelly disposed major surfaces, a major portion of said wafer being of one conductivity type and including a plurality of spaced junction areas of substantially opposite conductivity type than said major portion on said first and second major surfaces, said junction areas being situated in oppositely disposed relationship on said major surfaces and defining at least two relatively spaced and thin bridge regions of said one conductivity type between each first surface junction and the corresponding second surface junction, and a plurality of low resistance electrodes making contact with said wafer first surface at points removed from said bridge regions; circuit means connecting a source of input signal current intermediate a first of said low resistance electrodes and one of said junction areas on said first major surface; means directly connecting another of said junction areas on said first major surface to a second of said low resistance electrodes; a source of bias potential; means connecting said source of bias potential intermediate said first junction area on said first major surface and a further one of said low resistance electrodes in a polarity direction to provide a reverse bias on the junctions of said first surface and thereby minimize the leakage currents of said second surface junctions; and output means, said output means being connected intermediate said first junction area on said first major surface and said junction areas on said second major surface.

11. Composite tetrode semiconductor amplifying apparatus comprising: a wafer of substantially single crystalline semiconductor material having first and second parallelly disposed major surfaces, a major portion of said wafer being of a certain conductivity type, said first major surface including a first ohmic contact and an inner and an outer relatively spaced junction area means arranged thereon, said junction areas being of substantially opposite conductivity type than said major portion and having a substantially annular configuration, further junction area means of opposite conductivity type on said second major surface being situated in substantially oppositely disposed physical relationship to said inner and outer junction area means, said further junction area means being in electrical relationship with both said inner and outer junction area means, and second and third ohmic contacts arranged on said wafer on opposite sides of said outer junction area; circuit means connecting a source of input signal current intermediate said first ohmic contact and said outer junction area means; means directly connecting said inner junction area means to said third ohmic contact; a source of bias potential; means connecting said source of bias potential intermediate said outer junction area means and said second ohmic contact, said bias potential being of such a polarity as to provide a reverse bias across said inner and outer junction; and output means connected intermediate said outer junction area means and said further junction area means.

12. A signal amplifying device comprising: a plurality of tetrode semiconductor amplifying means, each of said semiconductor amplifying means including a collector electrode, an emitter electrode, and first and second base electrodes; output means; a source of electrical potential; means including said output means and said source of electrical potential intermediate the emitter electrode of the last of said plurality of semiconductor means and said collector electrodes; circuit means including bias potential means, said circuit means being connected between said last semiconductor emitter electrode and said second base electrodes, said bias means being in a polarity direction to provide a reverse bias on the emitter junctions; means connecting the first base electrode of the first of said plurality of semiconductor means and said last semiconductor emitter electrode to a source of input signal current; and means directly connecting the emitter electrode of each of said plurality of semiconductor means save the last to the first base electrode of the subsequent of said plurality of semiconductor means.

13. Signal translating apparatus comprising: a plurality of tetrode semiconductor amplifying means, each of said semiconductor means including an input electrode, an output electrode making junction contact with the semiconductor body, a further electrode, and a bias electrode; means directly interconnecting said output electrodes of said plurality of semiconductor means; means connecting the further electrode of each save the last of said plurality of semiconductor means to the input electrode of the subsequent one of said plurality of semiconductor means; means connecting the input electrode of the first and the further electrode of the last of said semiconductor means to a source of input signal potential; circuit means interconnecting said bias electrodes of said plurality of semiconductor means; further circuit means including bias potential means connecting the further electrode of the last of said plurality of semiconductor means to said bias electrodes, said bias potential means being in a polarity direction to provide a reverse bias on the junction between said bias and further electrodes; a source of electrical potential; output means; and circuit means including said output means and said source of electrical potential connected intermediate said further electrode of said last semiconductor means and said output electrodes thereby energizing said translating apparatus.

No references cited.